United States Patent [19]

Siefkes et al.

[11] Patent Number: 4,963,238

[45] Date of Patent: Oct. 16, 1990

[54] METHOD FOR REMOVAL OF ELECTRICAL SHORTS IN A SPUTTERING SYSTEM

[76] Inventors: Jerry D. Siefkes, 737 N. Taft Hill Rd., Fort Collins, Colo. 80521; John G. Harpold, 6203 N. County Rd. 29, Bellvue, Colo. 80512; Douglas S. Schatz, 901 Lochview Ct., Fort Collins, Colo. 80524

[21] Appl. No.: 297,707

[22] Filed: Jan. 13, 1989

[51] Int. Cl.$^5$ .............................................. C23C 14/54
[52] U.S. Cl. ........................... 204/192.12; 204/298.08; 204/192.13
[58] Field of Search ..................... 204/192.12, 192.13, 204/298 MT, 298 PS

[56] References Cited

U.S. PATENT DOCUMENTS

| | | | |
|---|---|---|---|
| 3,392,304 | 7/1968 | Anderson | 315/14 |
| 3,400,207 | 9/1968 | Anderson | 373/12 |
| 3,544,913 | 12/1970 | Anderson | 328/267 |
| 3,546,606 | 12/1970 | Anderson et al. | 328/267 |
| 3,609,200 | 9/1971 | Anderson | 373/12 |
| 3,748,536 | 7/1973 | Andresen | 361/57 |
| 3,839,182 | 10/1974 | Sager | 204/298 |
| 4,103,324 | 7/1978 | Vandervelden et al. | 204/298 |
| 4,610,775 | 9/1986 | Phifer | 204/298 |

FOREIGN PATENT DOCUMENTS 3121389  8/1982  Fed. Rep. of Germany ...... 204/298 PS

OTHER PUBLICATIONS

D. Schatz, "The MDX as a Strategic Tool in Reducing Arcing", Advanced Energy Industries, Fort Collins, Colo., (1985).

T. C. Grove, "Arcing Problems Encountered During Sputter Deposition of Aluminum", Advanced Energy Industries (1986).

Press Release, "New Arc-Check TM Provides Sustained Arc. Control", Advanced Energy Industries, Jan. 14, 1988.

Product Literature "MDX-10K Series DC Magnetron Drives", Advanced Energy Industries (1988).

"The Basics of Sputtering", Third Edition, Materials Research Corp., Orangeburg, N.Y., (1980), pp. 3-43.

Primary Examiner—Aaron Weisstuch
Attorney, Agent, or Firm—Luke Santangelo

[57] ABSTRACT

Techniques for removing an electrical short caused by a flake in a thin film sputtering system are disclosed. The flake typically bridges the dark space between target and anode or shield and is removed through manipulation of the power supply utilized for normal operations. Sensing of the flake and discrimination between recoverable arcs is accomplished by timing the duration of an over-current condition. Removal involves switching between power mode or some other initial mode of regulation and current modes and progressively increasing current to melt the flake. Circuitry automatically removes the flake and is easily adapted to power supplies particularly more sophisticated, high frequency, lower energy storage DC supplies.

28 Claims, 8 Drawing Sheets

METHOD FOR REMOVAL OF ELECTRICAL SHORTS IN A SPUTTERING SYSTEM

BACKGROUND OF THE INVENTION

Generally the invention relates to the field known as thin film processing through sputter techniques. More specifically, the invention focuses on the undesirable aspect of electrical shorts during the sputter process, presenting both methods and apparatuses for removing such electrical shorts upon their occurrence.

The sputtering process in general is well known in the art. It was apparently first reported in 1852 by Sir William Robert Groves. In 1921 Joseph John Thompson initially named the process "spluttering"; later the "l" was dropped and the name for the process became "sputtering." This term is meant to describe a process whereby atoms of a material are mechanically freed from a surface through a momentum transfer. The atoms then dissipate to cause a thin film on or interact with a surface or substrate. Although the sputtering process has been known for some time, in recent years applications of the process have grown dramatically and have been subject to refinement and development with technological advances. To a significant degree the increase in focus on the sputtering process has been due to the growth of the semiconductor industry which has increased the focus on thin film processes in recent years and has made available more sophisticated equipment to practice the process.

To properly understand the problem addressed through the present invention, it is necessary to generally understand the operation of the sputter process. An excellent discussion of the process is contained in the textbook *Glow Discharge Processes* by Brian Chapman published in 1980 by John Wiley & Sons, Inc. As relevant to the present invention, the sputter process is a process whereby the surface of an item is coated (deposition), removed (etched), or whereby the surface of an item is conditioned. In basic form, a sputtering system involves a power supply which ionizes a gas. This ionized gas or plasma then accelerates to a target which contains the material that will become the coating. When the ions strike the target, atoms of the target are released through momentum transfer. These atoms then dissipate and some eventually contact a substrate and become a coating on that substrate. Although it is a goal to achieve as uniform a process as possible, inherent noise and anomalies in both the plasma generation and the material of the target can cause fluctuations in the process. These fluctuations can result in the release of particles or flakes from the target rather than the individual atoms desired. In addition—and perhaps to a more significant degree—the coating itself tends to peel off of all surfaces in the chamber. When it peels off of any surface, flakes are created which fall or lodge across the power supply. Also, the coating can build up in undesirable places. This results in the same effects as a flake and is thus referred to synonymously as such. In particular target geometries, occasionally one of these flakes occurs across the power supply causing an electrical short. Such a short is not only undesirable but they are very difficult to predict because the entire environment is very dynamic.

The significance of these flakes for the particular target geometries involved is a function of two factors: the energy capacity of the power supply and the particular target material involved. In prior years it was common to utilize power supplies which rectified relatively low frequency line sources and which had high energy capacities relative to the amount of energy necessary to melt the types of flakes which are the focus of the present invention. In recent years it has become understood by those skilled in the art that higher frequency, lower capacity power supplies provide better process control for reasons unrelated to the occurrence of flakes. Although the older, high energy capacity power supplies easily release sufficient energy into some flakes to not just melt, but to vaporize the flake, larger flakes exist which are not melted during normal processing. When the more sophisticated, lower energy capacity power supplies are utilized, however, the flake problem becomes more acute. Not only are the larger flakes not melted, but the smaller flakes now become a problem as well. These lower energy storage power supplies simply react too quickly and have insufficient stored energy to melt even the smaller flakes which occur. Prior to the present invention, when a flake did occur for these more sophisticated power supplies, an over current condition would automatically shut down the power supply. Those skilled in the art then would manually shut down the entire sputter system and would physically remove the flake from the target surface. This not only necessitated long time delays but it also caused an unevenness in the treatment of the substrate. The present invention addresses this problem as it relates to both the older, higher energy storage power supplies and as it relates to the more sophisticated, lower energy storage power supplies. Since the problem is more acute in the lower energy storage power supplies, however they are the focus of this disclosure.

As mentioned, another factor involved in the occurrence of flakes is the nature of the particular target involved. Although almost all targets are commercially manufactured to minimize the possibility of an occurrence of a flake or impurity being released, some materials are more prone to this than others. For instance the invention in U.S. Pat. No. 4,610,775 to Phifer is directed to the occurrence of flakes when coating nuclear fuel pellets with a thick layer of zirconium diboride ($ZrB_2$). Apparently this material has a tendency to produce flakes. The Phifer disclosure patents the solution of providing a separate AC power supply, which provides 150 to 200 amps at 60 volts AC to melt those flakes. In sharp contrast, the present invention provides a simpler, less expensive solution which utilizes the existing power supply to melt the flakes. While the problem of electrical shorts caused by flakes has been known, the fact that the flakes shorted the power supply utilized in normal operation led those skilled in the art away from utilizing it as a solution to the problem. Since the flake shut down the power supply, it was felt that an external solution was required. Also in sharp contrast, the present invention provides only sufficiently enough energy to melt the flake, rather than to vaporize it. This avoids uncontrolled sputtering and provides a more uniform end result than solutions which may vaporize the flake. This is because "vaporizing" the flake results in it exploding and splattering material inside the system.

Similarly, inventions such as discussed in U.S. Pat. Nos. 3,544,913 and 3,546,606 to Anderson involve a totally different environment. As mentioned, those inventions relate to the field of electron beam processing in which an arc discharge is "starved" before development by quickly limiting the current which creates the electron beam. Because those inventions involve arcs rather than flakes, the clearing or removal process is fundamentally different. The electrical short is not "starved" in the present invention, rather it is melted by driving more current through it.

SUMMARY OF THE INVENTION

The present invention is directed to methods and apparatuses for removing electrical shorts in sputtering systems. The methods address the problem of electrical shorts by providing a solution which is adaptable to both high and low energy storage power supplies as now used in many sputtering applications. It is an object of the invention to provide an automatic removal process, thus eliminating the need for frequent human intervention in the process. It is also an object of the present invention to provide the ability to remove most electrical shorts caused by flakes in a sputtering system in as rapid a time as possible. Thus it is also an object of the present invention to remove the flake and to then return to normal sputter processing as quickly as possible.

In addition, the present invention addresses the problem of electrical shorts in a sputtering system by manipulating the power supply used in normal operation to affect the removal phase. An object of the present invention is thus to affect removal through the single power supply involved in a simplified sputtering system. Accordingly it is an object of the present invention to provide the capability of removing most flakes without adding another power supply.

It is an object of the present invention to affect the removal by progressively increasing the application of current or by increasing current in a controlled manner. In one embodiment, it is also an object of the invention to provide a circuit through which the progressive increase in current is a linear increase.

It is also an object of the present invention to avoid uncontrolled sputtering by avoiding vaporizing, splattering, or exploding any flakes which occur. An object is thus to provide only sufficiently enough energy to remove the flake and to avoid supplying excess energy into the flake removal process.

It is a further object of the present invention to provide a circuit for switching the regulation mode of the power supply to thus affect immediate removal of most electrical shorts.

An important goal of the present invention is to provide a solution to the problem of flakes which minimizes the amount of equipment involved. An object is thus to provide as simple and as inexpensive a solution as possible.

It is also an object of the present invention to provide for methods which may be controlled through hardware or software configurations. An object of the present invention is to provide general techniques which may be readily adapted to a hardwired circuit such as disclosed herein, to a programmable processor as might be internally adapted to control a power supply, or to a computer system as might be externally utilized to control one or more power supplies.

It is still a further object of the invention to provide methods for the removal of an electrical short which may be easily adapted to existing power supplies and existing sputtering systems. This includes both DC and AC power supplies as are commonly utilized in a sputtering system.

Another object of the present invention is to present a technique and apparatus to automatically sense an electrical short or flake and to distinguish it from other occurrences of recoverable arcs or sparks. The present invention presents methods which can both minimize the possibility of an erroneous detection and which can detect the occurrence of a flake in as short a time as possible.

Naturally, further objects of the invention are disclosed throughout other areas of the specification and claims.

DETAILED DESCRIPTION OF THE PREFERRED EMBODIMENT

Figure 1B:
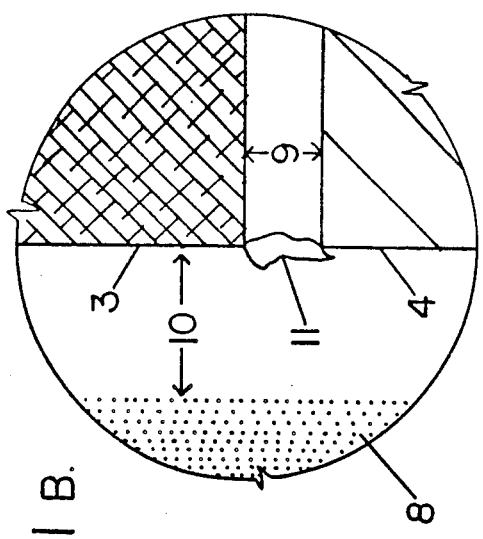
FIG. 1B is a diagram for explaining the formation short circuits in the sputtering system of FIG. 1A due to flakes.
Figure 1A:
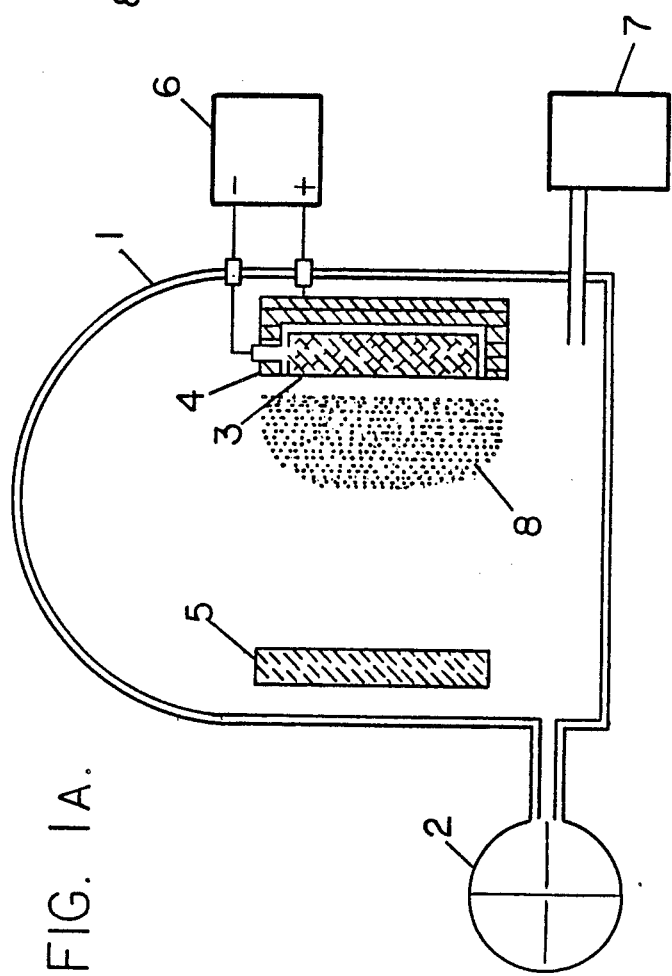
FIG. 1A is a diagram of a basic sputtering system.

As mentioned earlier, it is necessary to understand the general sputtering process in order to understand the scope and application of the present invention. FIG. 1 shows a cross section of a simplified sputtering system. The process occurs in a chamber (1) which is evacuated by vacuum pump (2). Within chamber (1) is placed a target (3) which will become the coating itself. In the particular target geometries involved, target material (3) is surrounded by anode (4) also within chamber (1). Anode (4) may serve as a shield as referred to in the literature when it is connected to ground. Anode (4) may, however, be electrically isolated from other shields within chamber (1). Chamber (1) also contains substrate (5) to be coated. In operation bias potential is maintained between target (3) and anode (4) through the connection of power supply (6). When sufficient vacuum is present within chamber (1), sputtering gas (7) is introduced in chamber (1). Sputtering gas (7) (typically an inert gas) is ionized by operation of power supply (6) and results in plasma cloud (8) being formed in a region adjacent to target (3). Plasma cloud (8) is maintained in equilibrium through the continuous operation of power supply (6). Power supply (6) not only ionizes the gas, but also attracts the ions to target (3). Though the resultant collision of ions into target (3), momentum is transferred from the ions to the surface of target (3), resulting in release of mostly uncharged atoms of the material of target (3). These atoms then freely dissipate and some strike substrate (5) and result in a coating on substrate (5).

In the particular type of sputtering system shown in FIG. 1, a specific, commercially available target assembly is involved. This target assembly is frequently characterized by a circular disk which becomes target (3) and which is surrounded along its periphery and backside by an electrically conducting anode (4). Although many different geometries are possible in various sputtering systems, with respect to the present invention an important characteristic of this type of target assembly is that the space between target (3) and anode (4), gap (9), is very small. Gap (9) is purposely kept small. Because of the physics involved and the purpose of the anode to allow creation of plasma only in the direction in which it is desired to sputter atoms, the distance of gap (9) is frequently sufficiently small to be less than the distance of dark space (10). Dark space (10) refers to the region close to target (3) and between plasma cloud (8) in which plasma does not exist. Because of the physics of the generation of plasma cloud (8), by maintaining gap (9) less than the distance across dark space (10), no plasma (and thus no sputtering) occurs between anode (4) and target (3). The technique of providing a small gap between target (3) and anode (4) is well known in the art and is discussed in the textbook *Glow Discharge Processes* by Brian Chapman referred to earlier.

Because of the physical necessity to keep gap (9) sufficiently small, occasionally particles or flakes may be released from target (3), may grow on shield (4), or may be released from other surfaces in chamber (1) which may be of sufficient size to bridge gap (9), thus causing an electrical short between target (3) and anode (4). This electrical short is therefore across power supply (6). Again, this occurrence of flakes and the release of particles from target (3) and other surfaces in chamber (1) is well known in the art. An excellent discussion of the reasons for the occurrence of flakes is available in the textbook *Deposition Technologies for Films and Coatings* by Rointan F. Bunshah et al., published in 1982 by Noyes Publications. Referring back to FIG. 1, in the expanded view involving gap (9), it can be seen that there is shown a flake (11). Flake (11) completely bridges gap (9) and is the reason for the present invention. With the advent of more sophisticated, high frequency, lower energy storage power supplies the problem of flakes has become more acute. As is known by those skilled in the art, such power supplies offer advantages in the actual sputtering process. One disadvantage is that they are not capable of melting even smaller flakes under normal conditions. Thus, upon the occurrence of flake (11), power supply (6) would be shut down. Those skilled in the art would then physically break vacuum and manually remove flake (11) through wire brushing or other means or were forced to utilize an auxiliary power supply as in U.S. Pat. No. 4,610,775. Although the benefits by use of the higher frequency, low energy storage power supplies greatly outweighed the determent of having to address even smaller flakes, this drawback has long been recognized although prior to the present invention no solution utilizing the existing power supply has been available.

In the present embodiment, power supply (6) is shown as a regulated DC power supply adapted to a power regulation mode. This involves voltages in the range of approximately 500 to 1500 volts and currents ranging from 10 to 20 amps. Such power supplies are well known and readily available to those skilled in the art. In addition, AC power supplies may be utilized. Naturally, the techniques and methods of the present invention may be adapted to such equipment as well.

As mentioned earlier, the problem which is addressed by the present invention exists for both the older, low frequency power supplies and the more sophisticated, higher frequency power supplies. It is more acute, however, for the latter. The characteristics of such a sophisticated, high frequency, power supply as they relate to sputtering are well known and are specifically discussed in the technical bulletins entitled "The MDX as a Strategic tool in Reducing Arcing" by Douglas S. Schatz first published in 1983 and "Arcing Problems Encountered During Sputter Deposition of Aluminum" by Thomas C. Grove published in 1986. Among the relevant characteristics, these power supplies (to which the present invention would be particularly important) would include lower energy storage, a regulation capability, a feedback loop and control circuitry as discussed later. While the present invention would not completely eliminate the problem of flakes, it would minimize it in the lower energy power supplies and would enhance it in the higher energy power supplies.

In operation, plasma cloud (8) operates to continuously release or sputter atoms from target (3). By its very nature, plasma cloud (8) operates somewhat randomly over target (3). Imperfections in target (3), ripple in the electrical potential supplied, and localized heating of target (3), among other factors, result in a degree of variability in the amount of atomic material released. The material also coats all surfaces in chamber (1). Many of these surfaces are not designed to have the coating adhere to them. These effects result in undesirable variations in the coating on substrate (5). These variations result in both the occurrence of arcs across dark space (10) and flakes across gap (9). Although both appear as lower impedance or higher current conditions, in fact over-current conditions, to power supply (6), the present invention must adequately distinguish between the two and react differently to continue processing. The entire environment of chamber (1) is electrically very noisy; a rough equilibrium is maintained. This equilibrium is maintained in such a noisy environment through regulation of power supply (6). The occurrence of an arc across dark space (10) can be quickly negated by short-term interruption of power supply (6) as known in the art. For convenience, these types of over-current conditions are thus referred to herein as "recoverable arcs." This interruption need only last for a few milliseconds after which full power or voltage may be restored to power supply (6) as it existed prior to the occurrence of the recoverable arc with no interruption in regulation mode. The process can accommodate these anomalies and can continue uninterrupted after the short interruption with little undesirable effect other than the loss of a few milliseconds. The second situation, the occurrence of flake (11) across gap (9), results in an electrical short from which recovery by the techniques referred to above is not possible.

In order to solve the problems raised by the electrical short caused by flake (11), the present invention discloses both methods and apparatuses. Rather than incorporate a second power supply as was done in the Phifer invention disclosed in U.S. Pat. No. 4,610,775 discussed earlier, the present invention would remove the flake through operation of existing power supply (6). As set forth in the claims, the methods presented herein involve several different combinations of steps.

Fundamentally the method involves two key steps. First the presence of an electrical short or flake (11) must be detected and discriminated from a recoverable arc. Although prior art had utilized a voltage or current criteria, it is believed that within the ranges necessary for general sputtering, an electrical short caused by a flake can be sensed by timing the duration during which power supply (6) is in an over-current condition. From application, it is believed that for typical sputtering environments, if recovery has not been effected in a period of time ranging from about 10 milliseconds to 5 seconds, the probability of recovery from the over-current condition, through mere interruption in the operation of power supply (6) as utilized for recoverable arcs is greatly reduced. In processing environments as discussed below, it is believed that any over-current condition which lasts longer than 50 milliseconds is usually an electrical short caused by flake (11). In understanding the detection of flake (11) through the technique of timing the over-current condition, it must be recognized that since sputtering environments can vary, so too might the specific parameters involved. This time (50 milliseconds) also allows a margin which allows for the inherent variations in the process. Since the process parameters can vary widely, the broad range of from 10 milliseconds to 5 seconds is deemed necessary to practically accommodate the process parameters presently in use. Naturally the threshold time for characterizing an overcurrent condition as unrecoverable or that of an electrical short caused by a flake will vary in different electrical and configuration situations.

Figure 2:
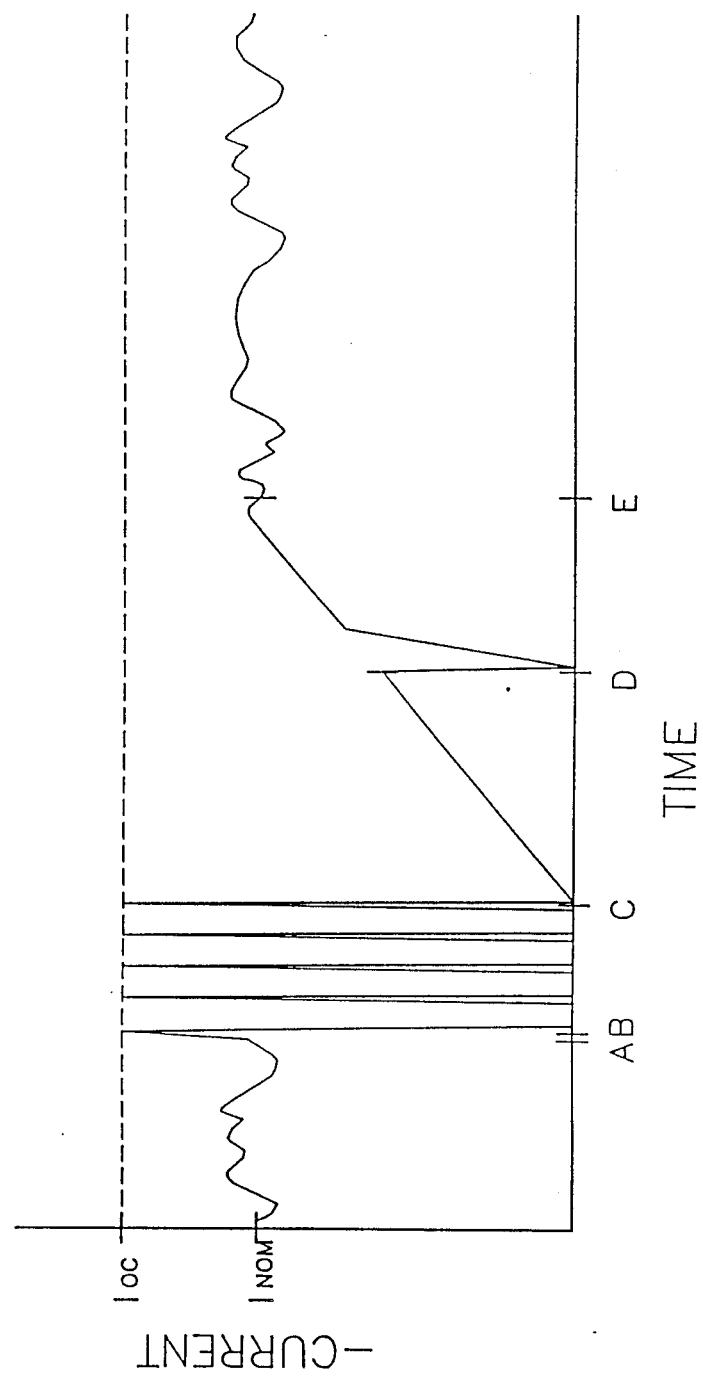
FIG. 2 is a graphic representation of the general behavior of the current which would be supplied by the power supply upon an occurrence of an electrical short caused by a smaller flake and its removal.

Referring to FIG. 2, the detection process can be graphically understood through the behavior of the current output by power supply (6). Prior to time (A) power supply (6) operates by outputting a relatively constant nominal current ($I_{nom}$). This nominal current ($I_{nom}$) is in essence a measure of the amount of plasma cloud (8) being attracted to substrate (5). In referring to FIG. 2, it should be understood as referred to before that the environment within chamber (1) is electrically very noisy. Some noise and variation is shown on the nominal current ($I_{nom}$), however, it is only shown in areas which are uninteresting, for simplicity. This is true for FIGS. 2, 3, 4 and 5. In addition, it should be understood that each of these figures is designed for conceptual understanding only, time and value scales are not meant to imply any scaled relationship and are not linearly—or even regularly—scaled. For instance, time (A) to (B) may be on the order of microseconds, time (B) to (C) on the order of tens of milliseconds, and time (C) to (E) on the order of hundreds of milliseconds.

As mentioned, power supply (6) operates nominally at times prior to time (A). At time (A) however, a flake occurs causing the current to rise. This current rise can be quite rapid and will eventually reach the over-current level ($I_{oc}$) triggering shut-off of power supply (6) through its own internal overcurrent protection circuitry. Because recoverable arcs exist, the power supply can shut off the current, wait a brief time, and then attempt a restart in the prior regulation mode (usually a power regulation mode). If restart is not successful, this sequence may produce a series of pulses similar to that shown conceptually in FIG. 2. This over-current sequence of events occurs as soon as the current shown in FIG. 2 reaches the level ($I_{oc}$) at time (B). In instances of a recoverable arc, this pulsed process will negate the over-current condition. In instances of an electrical short caused by flake (11), however, the pulsed process does not. Thus, in FIG. 2 a continuous pulsed sequence of events occurs between the initial over-current condition at time (B) and the final over-current condition at time (C). It is the difference in times between time (B) and time (C) which is measured to determine if an electrical short exists due to a flake. When the time of the over-current condition is sufficiently long, the decision that an electrical short due to the presence of flake (11) would be made.

As mentioned in the prior paragraph, power supply (6) usually controls the process in a power regulation mode. In many applications, however, other regulation modes such as voltage or even current regulation modes are utilized. Naturally, the present invention would encompass such aspects with little variation. It should be understood that the progressive increase in current is also useful in a process involving a current regulation mode since the current does overshoot and react unstably as in other regulation modes.

Figure 3:
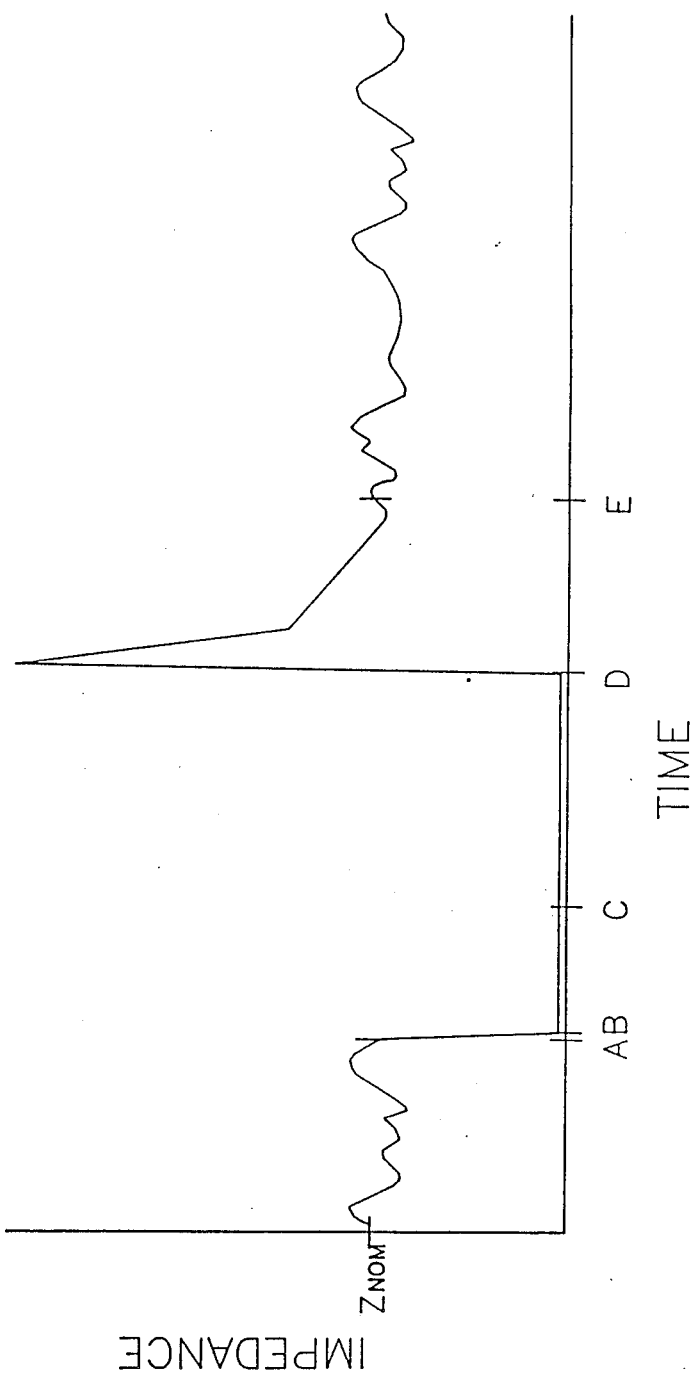
FIG. 3 is a graphic representation of the general behavior of the impedance across the power supply during the time corresponding to that shown in FIG. 2 upon an occurrence of an electrical short caused by a smaller flake and its removal.

Referring to FIG. 3, the effect of these varying current behaviors on the impedance across power supply (6) can be seen. Prior to the occurrence of flake (Il) at time (A), the impedance across power supply (6), namely that of plasma cloud (8) is in a relatively nominal state ($Z_{nom}$) with the inherent noise. Again, the noise shown in FIG. 3 is not drawn to scale as it is merely meant to convey the conceptual situation across plasma cloud (8). In addition, it should be understood that noise would exist throughout all phases, however, for proper understanding, it has been removed between times (B) and (E). At time (B) an overcurrent condition occurs. It is believed that both the overcurrent condition and the subsequent shut-off of power supply (6) results in almost immediate quenching of the charged condition of plasma cloud (8) through both recombination and attraction to other surfaces in chamber (1). Although this quenching results in an increase in the impedance of plasma cloud (8), the presence of flake (11) results in a decrease in the impedance across power supply (6). This decreased condition shown in FIG. 3 at time (B) will then exist so long as flake remains. Naturally, little noise will exist in the impedance so long as flake (11) exists across gap (9).

Once the presence of an electrical short due to flake (11) is detected, the second crucial step in the methods presented is that of automatically removing it. While those skilled in the art had, prior to the present invention, either broke the vacuum in chamber (1) and manually removed flake (11), or utilized a separate power source to melt the flake, the present invention provides methods where the condition would be automatically accommodated by the normal power supply. An aspect of this general approach is to remove flake (11) through manipulating power supply (6).

This manipulation would involve substantially stopping the application of power through power supply (6). This is typically done by pulling the current of power supply (6) to near a zero state. For practical reasons, current may even be pulled below zero, which through inclusion of diodes in the circuitry may appear as a short period of no current prior to the initiation of the progressive increase. Since this delay is merely a practical expedient and is not critical to the process, it is not shown in FIG. 2. Since both plasma cloud (8) and power supply (6) have capacitance, the nature of the sputtering process and the equipment associated with it makes it difficult and unnecessary to absolutely effect a complete stop of the application of power. Rather, a substantial reduction, usually through pulling the current through power supply (6) low would be sufficient as an initial step of the automatic clearing phase. Immediately upon the stop of the application of power, the removal of flake (11) is commenced through a progressive increase in the application of power supply (6). By "progressive," any number of functions through which power, current or any other parameter is increased is meant to fall within the spirit and scope of the present invention although the practical difficulties associated with a progressive increase in voltage or power make current the most practical focus at the present time. In the preferred embodiment, the circuitry discussed later provides for a linear increase in current through power supply (6). Again, while other modes or functions can be chosen, a linear increase in current seems to provide not only a method which can be easily obtained but also a method which would be stable and controlled in an inherently unstable environment.

Figure 4:
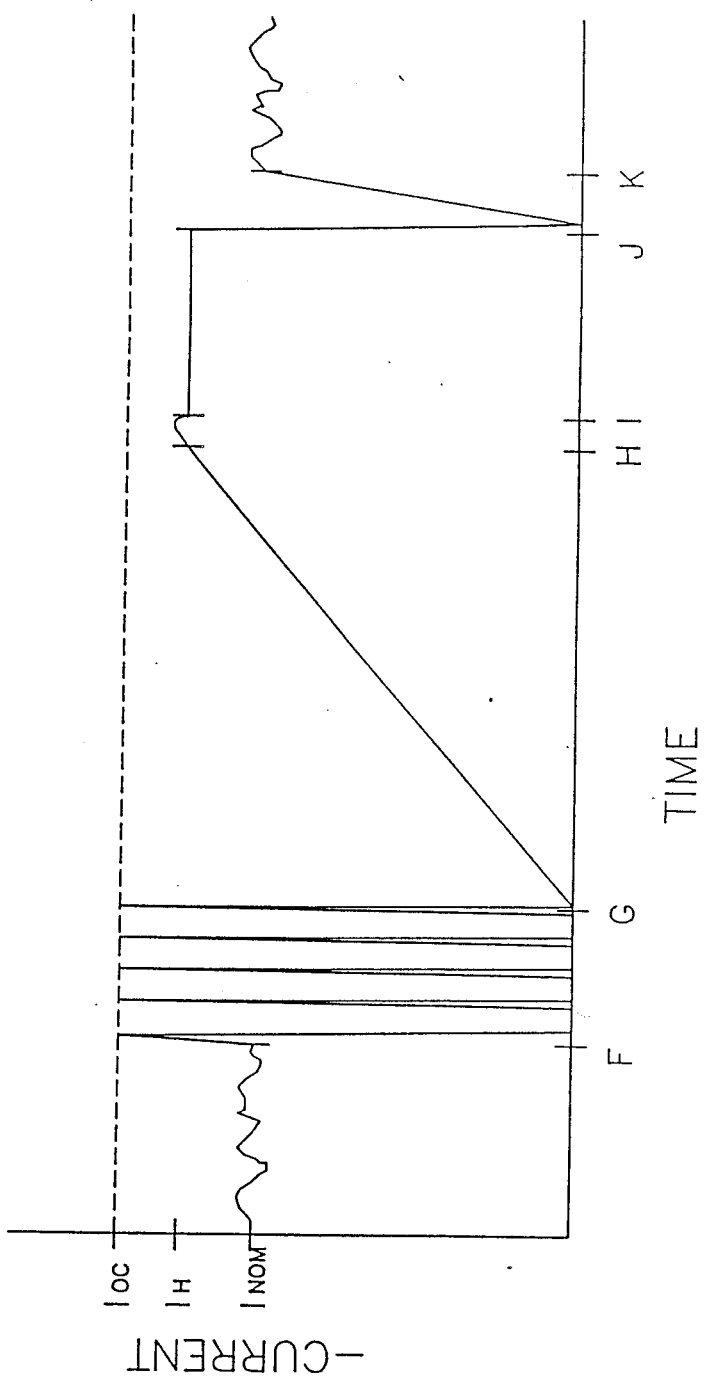
FIG. 4 is a graphic representation of the general behavior of the current supplied by the power supply upon an occurrence of an electrical short caused by a larger flake and its removal.
Figure 5:
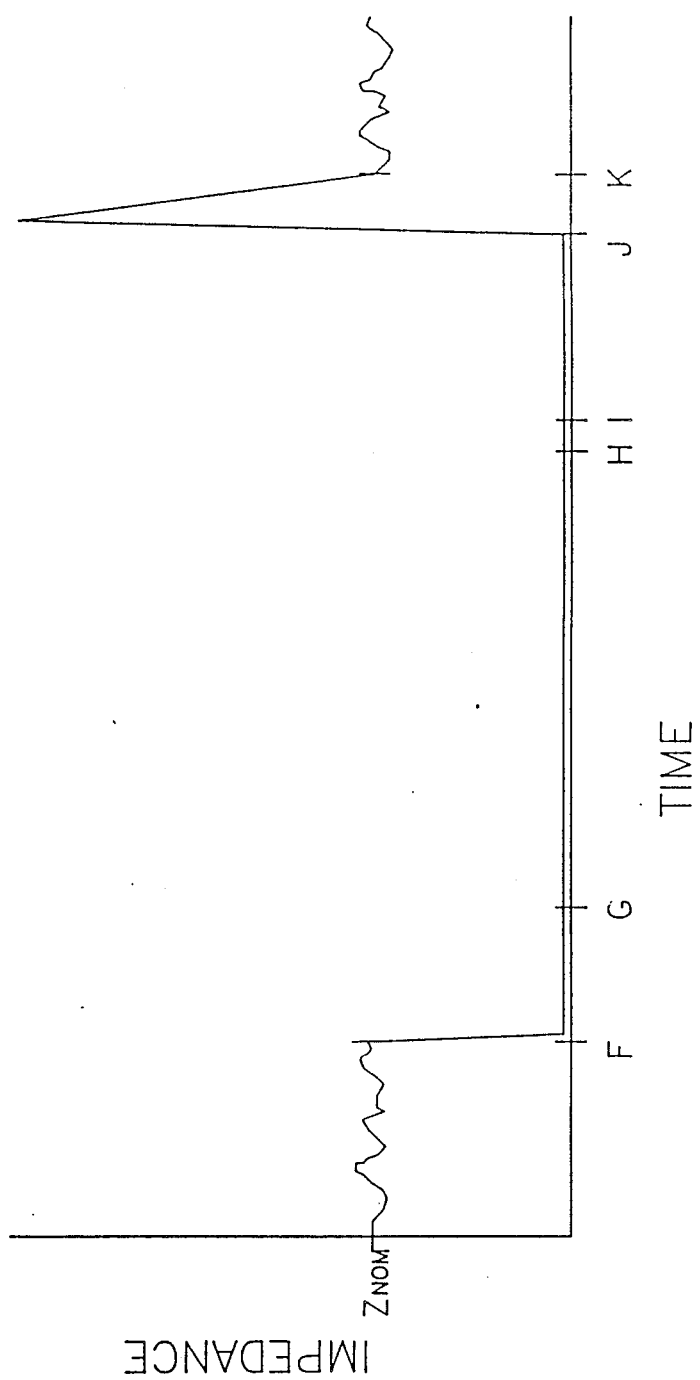
FIG. 5 is a graphic representation of the general behavior of the impedance across the power supply during the time corresponding to that shown in FIG. 4 upon an occurrence of an electrical short caused by a larger flake and its removal.

Since the physical processes occurring in chamber (1) during normal sputtering are usually controlled best by regulating a constant power across power supply (6), such regulation mode is assumed prior to the occurrence of any electrical short. Although known techniques to negate recoverable arcs involve merely shutting off and delaying the application of a set power in such mode, they do not work for the recovery from an electrical short due to a flake. In particular, the drastically reduced impedance across power supply (6) results in current overshoot immediately upon the application of even a small voltage across power supply (6). Although a maximum current protection system is frequently incorporated, such a system rarely can accommodate the overshoot associated with the almost immediate current increase upon the reapplication of even a low voltage across power supply (6). Thus, an important feature of the methods presented is switching modes from power or voltage to some other mode. Because a linear increase in current promotes a more stable and controlled recovery, a switch to a current regulation mode upon the occurrence of an electrical short due to flake (11) is a feature of this embodiment of the present invention. This feature involves power supply (6) automatically switching to the current regulation mode upon sensing flake (11) and pulling the current to zero as required to substantially stop the application of power supply (6). Immediately thereafter, current through power supply (6) would be linearly increased to remove flake (11) through melting. The linearly increasing current begins shortly after time (C) in FIG. 2 as soon as the current reaches the low condition. This increase continues (as shown in FIGS. 2 and 3) until either flake (11) melts or (as shown in FIGS. 4 and 5) a set level is reached. Referring now to FIGS. 2 and 3, a situation where the flake melts prior to reaching the set level is shown. This represents a smaller flake than that described in FIGS. 4 and 5. At time (D) it can be seen that the current rapidly decreases at time (D) when flake (11) melts. The comparison graph of impedance in FIG. 3 shows that at time (D) when flake (11) melts the impedance immediately goes very high. This is due to the fact not only that flake (11) no longer bridges gap (9) but also to the fact that plasma cloud (8) has been quenched and no longer exists. Since the circuitry of power supply (6) is linearly increasing the current during this time period, the current would quickly recover and continue its linear increase. This recovery results in very high voltages, thus restriking plasma cloud (8) and causing impedance to drop quickly and ultimately return to its nominal condition ($Z_{nom}$). This drop in impedance is shown in FIG. 3 between time (D) and (E). At time (E), the current reaches its nominal condition ($I_{nom}$) and the process is returned to its prior regulation mode and continues as it existed prior to the occurrence of flake (11). Referring to FIG. 2, it can be seen that in the vicinity of time (E) there is a slight overshoot in current. This over shoot is inherent to many power supplies and is not required for the present invention. It is merely shown as a practical limitation of the types of power supplies involved in the present invention. Again, after the current set level is reached, noise is included in both the current and impedance plots shown in FIGS. 2 and 3 to present realistic conditions.

As mentioned earlier in the context of discriminating between recoverable arcs and an electrical short due to a flake, since the parameters desired may vary from process to process, so too the time required for the linear increase may also be optimized to the particular environments involved. Although it is desirable to have the increase occur in the shortest possible time, current overshoot as in the strictly power-regulated situation limits how short a time might be utilized for the increase in current. Experimentally, it is deemed that variation in the time for increase in current from approximately 50 to 550 milliseconds is a reasonable range for the particular processes initially studied. Although the higher end, 550 milliseconds, is used for those specific conditions mentioned earlier, shorter periods of time are possible.

A margin between the maximum current level of the power supply, the over-current level ($I_{oc}$), and the point at which the current ramp stops should also be provided to accommodate any overshoot or noise that might occur at the top of the ramp as is inherent in many power supplies. If flake (11) has not been melted by the time current reaches this upper level, the current can be held for a sufficient period of time in which to melt flake (11) if possible. This is the situation shown in FIGS. 4 and 5, that of depicting the occurrence of a larger flake. Since holding a larger current through the flake for some larger period of time may slowly ablate or melt the flake away for some materials, this option may be important. In such instances, current can be held high indefinitely until operator intervention stops the process. For other materials, it may be desirable to shut off the power supply if removal has not been effected in a certain period of time and even to alert the operator automatically. Naturally, each of these aspects would fall within the embodiments possible under the present invention. Monitoring the power output is utilized throughout to determine when recovery has been completed.

Referring to FIGS. 4 and 5, the above step of removing flake (11) after completion of the linear increased in current can be further understood. In these figures, flake (11) occurs at time (F) and detection of it occurs at time (G). This is similar to that shown in FIGS. 2 and 3. At this point, power supply (6) is automatically switched from a power regulation mode to a current regulation mode and the current is immediately pulled toward zero. As shown in FIG. 4, the current is substantially zero. As mentioned earlier it is not necessary that the current be pulled completely to zero but rather that it be substantially reduced. Upon reaching substantially a zero state, the current is progressively increased to a current hold level ($I_h$) beginning shortly after time (G). As discussed earlier, it should be understood that a particular embodiment may include a brief delay after substantially reducing the current. Although the present embodiment does not have this characteristic, it is intended that such a minor difference would fall within the scope of the present invention.

As shown in FIGS. 2 and 4, the progressive increase is linear, although any other function is certainly possible. Considerations that might necessitate more complex circuitry or programming and might not provide for the degree of control desired are of course relevant. The period from time (F) to time (G) and time (G) to time (H) may also be varied or even optimized by programming as mentioned earlier. Upon initially reaching the hold current ($I_h$) at time (H), it can be seen in FIG. 4 that some overshoot of the current may occur. This overshoot is inherent in many power supplies and is one reason for selecting the hold level ($I_h$) at some level below the current over-current level ($I_{oc}$), The current eventually stabilizes at the hold level ($I_h$) as shown at time (I). At this point the circuitry holds the current at ($I_h$), during which melting of flake (11) may continue. At a point, time (J), flake (11) melts. As before, current rapidly decreases and impedance rapidly increases. Recovery of plasma cloud (8) and reduction of impedance is then effected as explained earlier. The current then reduces to the nominal current condition ($I_{nom}$) as it existed, prior to the occurrence of the electrical short. This is shown in FIGS. 4 and 5, at time (K). At this point, recovery from the flake is complete as plasma cloud (8) has returned to the condition existing prior to the electrical short and because the primary power supply has returned to the power regulation mode. Although there may still occur flakes which cannot be melted through these techniques, it is believed that such will be relatively rare for most process conditions.

Naturally, the methods discussed herein can be accomplished in a variety of ways ranging from hardwired circuitry to a computer implementation. Computer implementation could include programming the various steps and parameters on a programmable processor such as a microprocessor or on a separate controlling computer. Such programming might even include optimization routines to automatically determine the appropriate setting for the minimum time necessary to detect an electrical short caused by a flake or automatically determining the optimum levels and ways to progressively increase current to remove flake (11). It is intended that such variations would fall within the scope and spirit of the present invention as they could be easily accomplished by those skilled in the art once the methods of the present invention are understood. Although at present only hardwired embodiments have been achieved, the level of knowledge of those skilled in the art is such that embodiment in software or microprocessor programming through its associated memory could be easily accomplished without further explanation or undue experimentation. Such a programmable processor could internally control power supply (6) or could indeed control the entire sputtering system. Again, the step of programming the processor could easily be accomplished by those skilled in the art without undue experimentation based upon only a disclosure of the steps mentioned herein.

Figure 6:
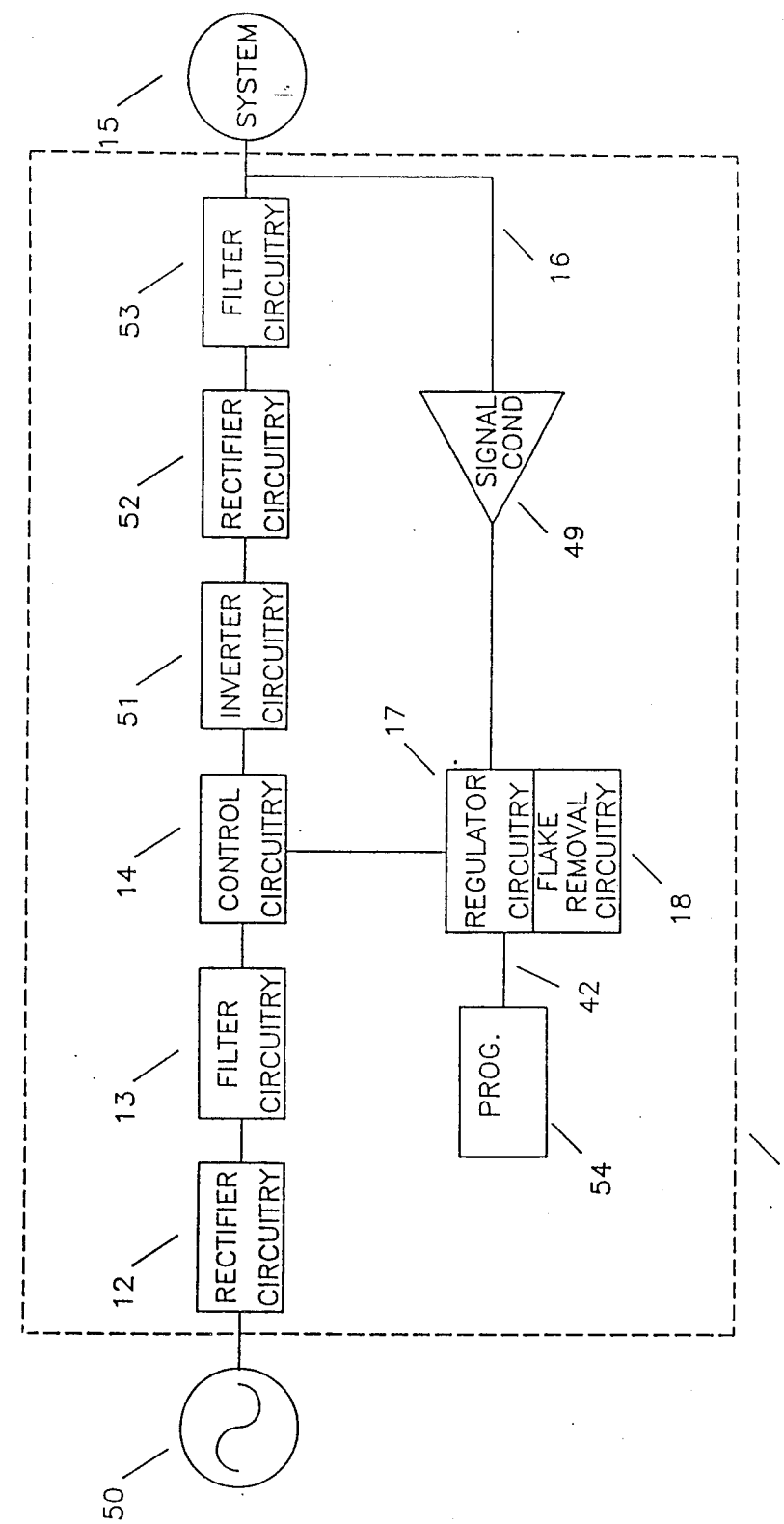
FIG. 6 is an expanded block diagram of a lower energy storage power supply modified to practice the present invention as might be connected to function in a sputtering system.
Figure 7:
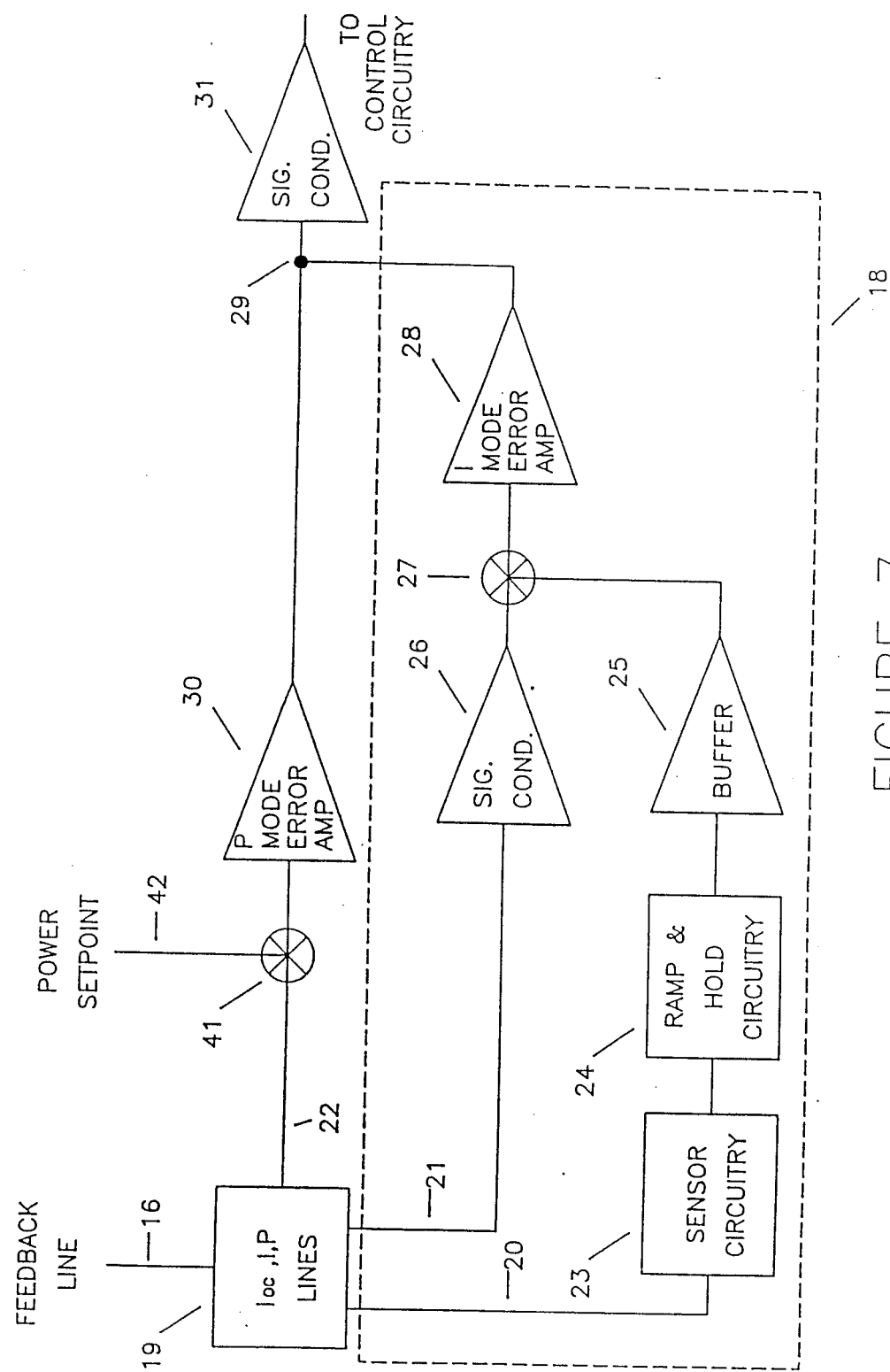
FIG. 7 is an expanded block diagram of the flake removal circuitry shown as a component in block form in FIG. 6.
Figure 8:
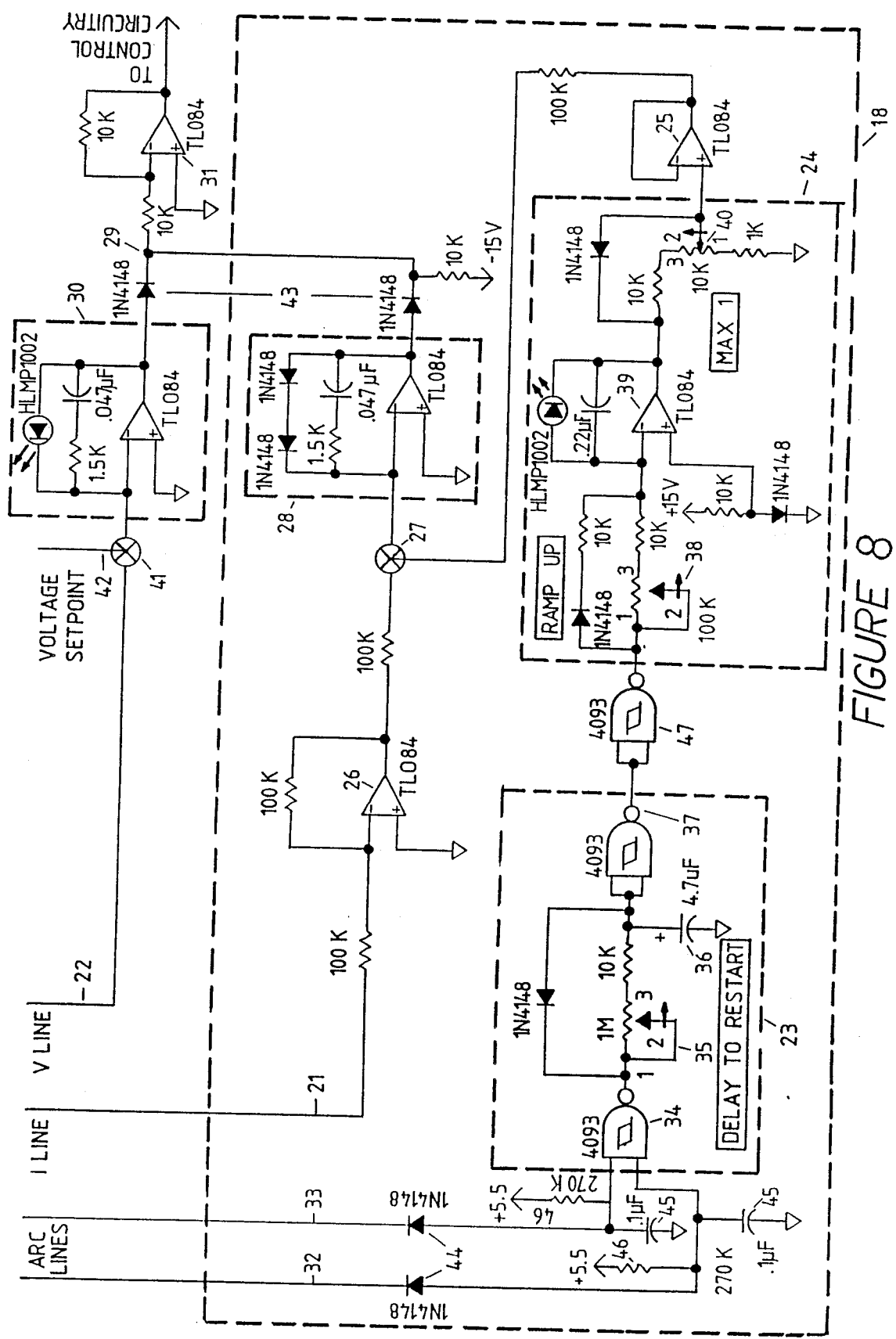
FIG. 8 is a schematic diagram of the flake removal circuitry shown in block form in FIG. 7.

The circuitry embodiment is discussed through the block diagrams shown in FIGS. 6 and 7 and the schematic shown in FIG. 8. Referring now to FIG. 6, it should be understood that a general type of power supply connected as power supply (6) may involve a regulated power source as is well-known in the art and readily available. In block diagram form, standard regulated power supplies utilize commercially available AC power (50) which may then be conditioned through rectifier circuitry (12) to convert to direct current. The output of rectifier circuitry (12) is then conditioned by filter circuitry (13). Control circuitry (14) may also be included. In the high frequency, low energy storage power supplies to which the present invention is particularly useful, the output may then be reconverted into a higher frequency AC power through inverter circuitry (51) for certain size and process-related considerations, and then passed through second rectifier circuitry (52) and second filter circuitry (53). The output from second filter circuitry (53) is then tapped for regulation before being passed to system (15).

An important feature of this type of power supply is the fact that the power supply is regulated. Although many techniques of regulation are possible, regulation through a feedback technique is the technique that has been utilized in the preferred embodiment. The feedback technique typically involves a feedback line (16) which, after passing through feedback signal conditioner (49), provides information concerning the various parameters of the output of the power supply (6). This information is then processed through regulator circuitry (17) as is well known in the art. In addition, the desired condition may be established through a manual setting or programmer (54), here shown with power setpoint line (42). This line establishes the level that regulator circuitry (17) attempts to maintain. In furtherance of one of the objects of the present invention, a simple addition to regulator circuitry (17) is the interconnection of the preferred embodiment referred to as flake removal circuitry (18). Flake removal circuitry (18) interacts with regulator circuitry (17) by utilizing the information provided by feedback line (16). This information is then processed to provide the appropriate input to control circuitry (14) in order to produce the effects described herein and achieve the methods discussed earlier.

Referring now to FIG. 7, flake removal circuitry (18) is further described in block form. From the diagram it can be seen that, conceptually, feedback line (16) provides information which is then split by feedback signal splitter (19). Although for simplicity and consistency with the conceptual diagram of FIG. 6, it has been shown that the three feedback signals derive from the same feedback line, it should be understood that in practice the separate feedback signals may be tapped from different points in the circuitry of the power supply shown in FIG. 6 including inverter circuity (51) and thus need not be split from a single feedback line (16) as shown. Particularly with respect to the circuitry shown, it should be understood that the feedback signals are actually tapped from such different points in the present embodiment and thus feedback signal splitter (19) does not exist. It has been shown only to conceptually simplify understanding the circuitry. Over-current condition line (20) indicates the over-current condition and is actually accessed from the inverter circuitry (51).

Current feedback line (21) indicates the level of the current output by the power supply and is accessed from the output of power supply (6). Power feedback line (22) indicates the product of the voltage and the current output by the power supply and is also accessed from feedback signal conditioner (49). Since such techniques and outputs are readily available or easily accessed in most power supplies, the specific interconnection for each of these lines is readily understood by those skilled in the art and needs no further explanation.

Referring now to over-current condition line (20), it can be seen that this input is provided to sensor circuitry (23) of flake removal circuitry (18). Sensor circuitry (23) functions to discriminate between over-current conditions due to a recoverable arc and over-current conditions due to a flake. This is accomplished by timing the duration of the over-current condition and thus sense the existence of an electrical short caused by a flake as described above in reference to the methods involved. Upon sensing the presence of a flake, sensor circuitry (23) triggers ramp-and-hold circuitry (24) to provide appropriate output which will cause control circuitry (14) to cause the desired response of power supply (6). This is accomplished by interconnecting the output of ramp-and-hold circuitry (24) after passing through buffer (25) with the output of current feedback line (21). For proper response, current feedback line (21) first passes through current signal conditioner (26) in order to achieve the proper response. Current signal conditioner (26) serves to both buffer and invert the signal of current feedback line (21) as required for proper combination through first summing junction (27) with the buffered output of ramp-and-hold circuitry (24). Although obvious to those skilled in the art, it should be understood that first summing junction (27) combines a positive and negative signal to create the difference between the absolute values for proper control. This first summing junction (27) serves, through negative feedback techniques, to combine the outputs of current feedback line (21) and ramp-and-hold circuitry (24). Thus combined, a current mode regulation output from first summing junction (27) is amplified through current mode error amplifier (28). This output from flake removal circuitry (18) is then combined with the output of well-known power regulation circuitry through junction (29). As shown, it can be seen that in similar fashion power regulation is achieved through a power mode error amplifier (30). Junction (29) thus functions as an "OR" combination of both the current mode regulation output from flake removal circuitry (18) and the power mode regulation output from power mode error amplifier (30). This "OR" combination is in essence a low signal select which automatically allows control to switch between current and power regulation modes very rapidly. This is accomplished by switching control to whichever error amplifier has the lowest absolute signal through function of diodes (43) shown in FIG. 8. Diodes (43) serve to block whichever signal line has a higher absolute amplitude. The "OR'd" output of junction (29) then passes through control signal condition (31) to provide input to control circuitry (14) as shown in FIG. 7. Control signal condition (31) functions to both buffer and invert the signal as required by the specific control circuit (14) utilized in the present embodiment.

Referring now to FIG. 8, the schematic details of flake removal circuitry (18) are shown. As can be seen in the schematic over-current condition line (20) is actually two separate lines (32 and 33) in the present embodiment. Both overcurrent condition line 1 (32) and over-current condition line 2 (33) function the same, they simply provide two different taps from which to sense the existence of an over-current condition. This is due to the fact that the particular power supply modified through addition of flake removal circuitry (18) in the present embodiment has two parallel components of inverter circuitry to produce sufficient current. Although ideally both components should indicate the presence of an over-current condition simultaneously, in practice such is not the case. The two overcurrent condition lines (32 and 33) are necessary to sense the occurrence of an over-current condition as soon as possible. Each of the two over-current condition lines (32 and 33) are also filtered through operation of capacitors (45), diodes (44), and resistors (46). These combinations serve to filter any transient spikes which might occur on either of the over-current condition lines (32 and 33) and thus transform the signals into a form which is more readily usable.

Both over-current condition line (32) and over-current condition line 2 (33) input into sensor circuitry (23). Within sensor circuitry (23) over-current condition line (32) and over-current condition line 2 (33) are connected through NAND gate (34). The output from NAND gate (34) is then connected through the circuitry shown which includes adjustable sensor resistor (35) and sensor capacitor (36). The output from this circuitry is then connected through gate (37) which serves as a trigger to provide output upon sensor circuitry (23) reaching the proper threshold. This threshold is established through the settings of adjustable sensor resistor (35) and sensor capacitor (36). Sensor circuitry (23) functions as a timer to determine the length of time during which an over-current condition has existed through requiring a specific time to charge sensor capacitor (36). The time required to charge sensor capacitor (36) is adjusted through adjustable sensor resistor (35) to establish the appropriate parameters as discussed earlier with respect to the methods of sensing the presence of an electrical short. Output from the sensor circuitry (23) is then inverted through gate (47) and becomes the input to ramp-and-hold circuitry (24). Sensor circuitry (23) is also designed to allow immediate discharge of sensor capacitor (36) if over-current condition lines (32 and 33) indicate that the over-current condition has ceased to exist. Through this feature, although recoverable arcs cause sensor capacitor (36) to begin charging, recovery from them causes the immediate discharge of sensor capacitor (36) re-initializing it to properly time the occurrence of a electrical short almost immediately.

Ramp-and-hold circuitry (24) consists of adjustable ramp resistor (38) which varies the time for the complete ramping to occur through connection with op amp (39) as an integrator, as is well known in the art. Output from op amp (39) is then held at a maximum level as determined through adjustable hold resistor (40). Again as was discussed earlier with respect to the methods involved, the level at which the ramp is held constant is determined by allowing a sufficient margin below the over-current level ($I_{oc}$) to accommodate any overshoot. The output of this circuitry is then passed through buffer (25) and into first summing junction (27) and is combined with the current level signal through simple connection.

As can be seen in the schematic, current signal conditioner (26) consists of an op amp connected as shown and as is well known in the art. Output from first summing junction (27) passes through current mode error amplifier (28) which consists of standard amplification circuitry as shown. Current mode amplifier (28) amplifies the sum of the signals at summing junction (27). Similarly power mode error amplifier (30) amplifies the sum of the signals at second summing junction (41). These signals consist of power feedback line (22) and power setpoint line (42). This output is then combined with the output of current mode error amplifier (28) at junction (29). This output is conditioned by control signal conditioner (31) and becomes the input to control circuitry (14). As can be seen the entire flake removal circuitry (18) is shown in FIG. 8. It should be understood that although both first- and second-summing junctions (27 and 41) utilize techniques well known in the art, in the present embodiment they are using negative feedback signals. These negative feedback signals are added to positive circuitry outputs to create a signal which is the difference between the desired level and the feedback or actual output level to properly control power supply (6).

With respect to the specific values used in flake removal circuitry (18), the significant values are shown in FIG. 8. Naturally different values might be utilized without departing from the scope and spirit of the present invention. Standard part designation numbers for packaged components are also shown. These numbers, such as "TLO84" for buffer (25), indicate the particular part type used in the present embodiment. Naturally, other part types might also be utilized as there are many ways in which to achieve the desired goals mentioned herein. It should also be understood that while the circuitry shown in FIG. 8 represents the preferred embodiment at the present time, many variations of the circuitry and even entirely different circuitry or software are possible to achieve the objects of the present invention. To the extent such variations utilize the teaching of this present invention and achieve its methods and purposes, it is intended that such other variations will also fall within the scope and spirit of the present invention.

We claim:

1. A method of removing electrical shorts caused by a flake in a sputter system, comprising the steps of:
   a. driving the sputter system in normal operation by a power supply;
   b. detecting the presence of an electrical short caused by a flake across said power supply; and
   c. manipulating said power supply in a manner which melts said flake to remove the electrical short.

2. A method of removing electrical shorts in a sputter system as described in claim 1 wherein said step of manipulating the power supply is automatic.

3. A method of removing electrical shorts in a sputter system as described in claim 2 wherein said step of manipulating the power supply comprises the steps of:
   a. substantially stopping the application of power by the power supply; and then
   b. progressively increasing the application of current by the power supply.

4. A method of removing electrical shorts in a sputter system as described in claim 2 wherein said step of driving the sputter system by a power supply comprises the step of regulating said power supply in a first mode and wherein said step of manipulating the power supply comprises the steps of sequentially:
   a. switching to regulate the current of said power supply upon detecting the presence of an electrical short;
   b. substantially stopping the application of current through the power supply; and
   c. progressively increasing the current output by the power supply.

5. A method of removing electrical shorts in a sputter system as described in claim 4 and further comprising the step of returning to regulate said power supply in said first mode after progressively increasing the current output by said power supply and upon the removal of the electrical short.

6. A method of removing electrical shorts in a sputter system as described in claim 4 and further comprising the step of holding the progressive increase of said current output upon reaching a set level.

7. A method of removing electrical shorts in a sputter system as described in claim 5 and further comprising the step of holding the progressive increase of said current output upon reaching a set level prior to said step of returning to regulating said power supply in said first mode.

8. A method of removing electrical shorts in a sputter system as described in claim 7 and further comprising the step of monitoring the criteria of said first mode of said power supply while accomplishing the step of manipulating said power supply to remove the electrical short.

9. A method of removing electrical shorts in a sputter system as described in claim 5 wherein said step of returning to said first mode of regulation is accomplished when the criteria of said first mode reaches a particular value.

10. A method of removing electrical shorts in a sputter system as described in claim 8 wherein said step of returning to said first mode of regulation is accomplished when the criteria of said first mode equals 100% of the set value of that criteria prior to detecting the presence of the electrical short.

11. A method of removing electrical shorts in a sputter system as described in claim 4 wherein said progressive increase is linear.

12. A method of removing electrical shorts in a sputter system as described in claim 10 wherein said progressive increase is linear.

13. A method of removing electrical shorts in a sputter system as described in claim 12 wherein the time of said linear increase is adjustable.

14. A method of removing electrical shorts in a sputter system as described in claim 10 wherein the time of said linear increase is from 50 ms to 550 ms.

15. A method of removing electrical shorts in a sputter system as described in claim 4 wherein the time of said progressive increase is from 50 ms to 550 ms.

16. A method of removing electrical shorts in a sputter system as described in claim 1 wherein said step of detecting the electrical short comprises the step of sensing an over-current condition in said power supply for a prescribed period of time.

17. A method of removing electrical shorts in a sputter system as described in claim 16 wherein said time for sensing the over-current condition is adjustable.

18. A method of removing electrical shorts in a sputter system as described in claim 16 wherein said electrical short is detected by sensing the over-current condition for a period of time from 10 ms to 5 seconds.

19. A method of removing electrical shorts in a sputter system as described in claim 16 wherein said electrical short is detected by sensing the over-current condition for 50 ms.

20. A method of removing electrical shorts in a sputter system as described in claim 5 wherein said step of detecting the electrical short comprises the step of sensing an over-current condition in said power supply for a prescribed period of time.

21. A method of removing electrical shorts in a sputter system as described in claim 20 wherein said time for sensing the over-current condition is adjustable.

22. A method of removing electrical shorts in a sputter system as described in claim 20 wherein said electrical short is detected by sensing the over-current condition for a period of time from 10 ms to 5 seconds.

23. A method of removing electrical shorts in a sputter system as described in claim 20 wherein said electrical short is detected by sensing the over-current condition for 50 ms.

24. A method of removing electrical shorts in a sputter system as described in claim 13 wherein said step of detecting the electrical short comprises the step of sensing an overcurrent condition in said power supply for a prescribed period of time.

25. A method of removing electrical shorts in a sputter system as described in claim 24 wherein said time for sensing the over-current condition is adjustable.

26. A method of removing electrical shorts in a sputter system as described in claim 24 wherein said electrical short is detected by sensing the over-current condition for a period of time from 10 ms to 5 seconds.

27. A method of removing electrical shorts in a sputter system as described in claim 24 wherein said electrical short is detected by sensing the over-current condition for 50 ms.

28. A method of removing electrical shorts in a sputter system as described in claims 2, 3, 4, 6, 8, 9, 13, 17, 21, or 25 and further comprising the steps of:
   a. controlling said power supply through a programmable processor; and
   b. programming said processor to automatically execute the sequence of steps involving the power supply.

* * * * *